United States Patent [19]
Zinke et al.

[11] Patent Number: 5,880,614
[45] Date of Patent: Mar. 9, 1999

[54] CIRCUIT ARRANGEMENT FOR EVALUATING THE OUTPUT SIGNAL OF AN ACTIVE SENSOR

[75] Inventors: Olaf Zinke, Hofheim; Wolfgang Fey, Niedernhausen; Michael Zydek, Langgons, all of Germany

[73] Assignee: ITT Manufacturing Enterprises Inc., Wilmington, Del.

[21] Appl. No.: 809,501

[22] PCT Filed: Sep. 18, 1995

[86] PCT No.: PCT/EP95/03655

§ 371 Date: May 7, 1997

§ 102(e) Date: May 7, 1997

[87] PCT Pub. No.: WO96/09691

PCT Pub. Date: Mar. 28, 1996

[30] Foreign Application Priority Data

Sep. 24, 1994 [DE] Germany .................. 44 34 180.6

[51] Int. Cl.⁶ .................................................. H03K 5/08
[52] U.S. Cl. .................................... 327/205; 327/206
[58] Field of Search .................... 327/205, 206, 327/72–75, 77–82

[56] References Cited

U.S. PATENT DOCUMENTS

| | | | |
|---|---|---|---|
| 4,532,437 | 7/1985 | Bodig et al. | 327/72 |
| 4,947,091 | 8/1990 | Fukuoka | 318/434 |
| 5,014,675 | 5/1991 | Koiwa | 123/609 |
| 5,218,298 | 6/1993 | Vig | 324/251 |

FOREIGN PATENT DOCUMENTS

| | | |
|---|---|---|
| 0482271 | 4/1992 | European Pat. Off. . |
| 2484737 | 6/1981 | France . |
| 2559618 | 10/1985 | France . |
| 3027398 | 2/1982 | Germany . |
| 3208262 | 9/1983 | Germany . |
| 3936831 | 5/1991 | Germany . |
| 4033740 | 4/1992 | Germany . |
| 4122029 | 11/1992 | Germany . |
| 4202137 | 7/1993 | Germany . |
| 4331722 | 3/1994 | Germany . |
| 4308031 | 4/1994 | Germany . |
| 9318412 | 9/1993 | WIPO . |
| 9406030 | 3/1994 | WIPO . |
| WO9609691 | 3/1996 | WIPO . |

OTHER PUBLICATIONS

Japanese Publication 56–145757 vol. 7 No. 132 (Jun. 9, 1983).

Japanese Publication 61–165572 vol. 12 No. 232 (Jun. 30, 1988).

Search Report of the German Patent Office for Application P4434180.6.

English Translation of the International Preliminary Examination Report of International Appl. No. PCT/EP95/03655.

*Primary Examiner*—Tuan T. Lam
*Attorney, Agent, or Firm*—J. Gordon Lewis; Thomas N. Twomey

[57] ABSTRACT

To evaluate the output signal of an active sensor which is configured as a binary current signal, a circuit arrangement is disclosed by which a proportional current is produced from the sensor current by way of a current mirror circuit. The current produced by a current mirroring operation is drawn from a stabilized voltage source by way of an ohmic resistance, and a binary voltage signal corresponding to the sensor output signal is generated thereby. The voltage signal is sent to a flipflop which compares the voltage signal with a reference value that is composed of a reference voltage and a hysteresis voltage. The change-over threshold of the flipflop is varied or adapted as a function of the actual sensor current, leakage currents, etc.

7 Claims, 3 Drawing Sheets

CIRCUIT ARRANGEMENT FOR EVALUATING THE OUTPUT SIGNAL OF AN ACTIVE SENSOR

BACKGROUND OF THE INVENTION

The present invention relates to a circuit arrangement for evaluating the output signal of an active sensor which is configured as a binary current signal, i.e., a square-wave signal with two different current levels.

German patent application No. 39 36 831 discloses a circuit arrangement for conditioning the output signal of a rotational speed sensor. The circuit arrangement includes a trigger circuit or flipflop having change-over thresholds which are varied in response to a coupling factor that influences the output voltage of the sensor. A circuit arrangement of this type is appropriate for use in passive and active sensors. When evaluating the output signal of an active sensor which issues a binary current signal, however, a current/voltage conversion by way of a serially connected load impedance of a relatively low ohmic value would be necessary to provide a sufficient operating voltage for the active sensor. This impedance would require a great load capacity to withstand a short-circuit of the sensor line with respect to the supply voltage. In addition, a high degree of accuracy of the impedance would be necessary because the signal identification of the sensor depends on this accuracy. Impedances of this type are complicated, and the high energy consumption is a shortcoming. Identification of sensor errors would be possible only by additional circuit structure. Overlapping of the range of function and range of error identification is not possible with such a circuit arrangement when used in an active sensor.

OBJECT OF THE INVENTION

It is an object of the present invention to provide a circuit arrangement which ensures a reliable identification of the output signal of an active sensor issuing a binary current signal even with unfavorable voltage tolerances and tolerances of structural elements. Further, leakage currents or shunts (as long as they do not exceed a predetermined extent) which are inevitable in practical operations, should not impair the evaluation of the sensor signal. However, short-circuits of the sensor lines to ground or relative to the current supply, short-circuits among the sensor lines and interruptions of the sensor lines should be perceptible nevertheless. In addition, the circuit arrangement should be especially appropriate for application as an integrated circuit.

SUMMARY OF THE INVENTION

It has been found that this object may be achieved by the circuit arrangement described in patent claim 1. The special features of the circuit arrangement of the present invention include that signal currents proportional to the sensor current are produced from the sensor current by way of a current mirror circuit, the current induced by a current mirroring operation is drawn from a (stabilized) voltage source by way of an ohmic resistance, whereby a binary voltage signal corresponding to the sensor output signal is generated, the voltage signal is sent to a flipflop which has a variable change-over threshold and compares the voltage signal with a reference value composed of a reference voltage and a hysteresis voltage, and the change-over threshold of the flipflop is responsive to the reference value.

A current mirroring operation of the type according to the present invention may easily be achieved by an integrated circuit. The relatively high sensor current is converted by way of the current mirror into a lower current which can be evaluated with low energy consumption. The lower current is drawn from a stabilized voltage source by way of an ohmic resistance in order to generate a voltage signal which can be evaluated by way of a flipflop and is indicative of the course of the sensor signal.

In a preferred aspect of the present invention, the reference voltage is varied as a function of the actual sensor current, which is influenced by leakage currents, shunts, the magnitude of the supply voltage, etc., or as a function of the transformed current that is derived by a current mirroring operation. The change-over threshold of the flipflop is thereby adapted to the sensor current. This permits a reliable identification and evaluation of the sensor signal even when unfavorable tolerances prevail, leakage currents are superposed, or when the sensor current is reduced due to shunts.

Still further, particularly favorable aspects of the present invention are described in the subclaims.

Further details of the present invention can be seen in the following description of embodiments, making reference to the accompanying drawings.

DETAILED DESCRIPTION OF THE INVENTION

Figure 1:
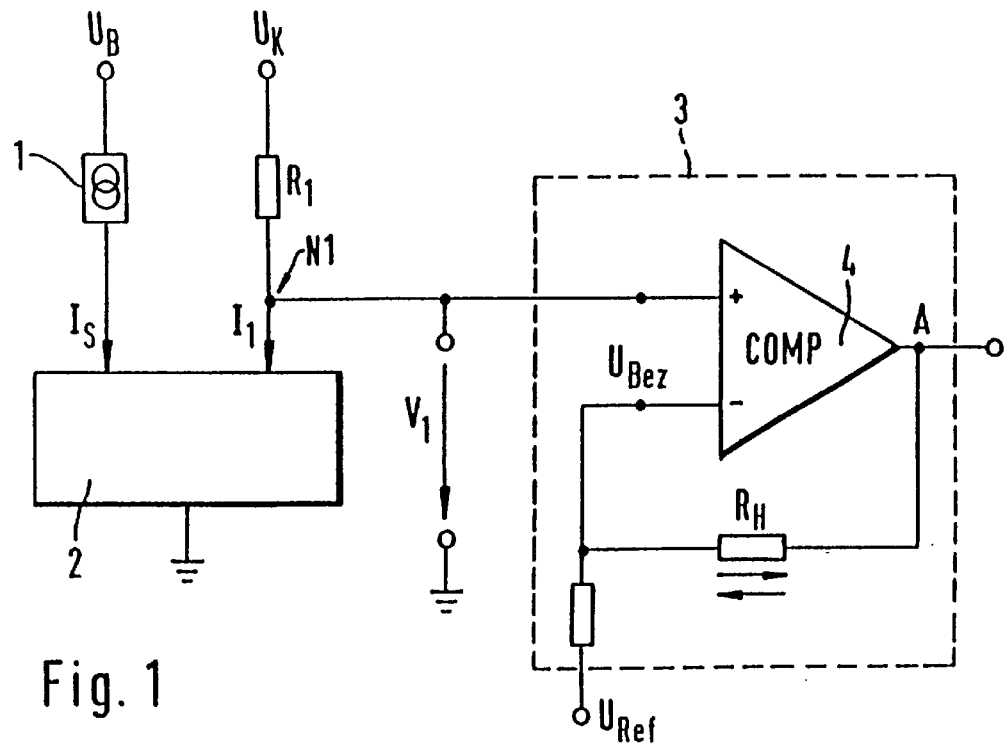
FIG. 1 is a schematically simplified partial view of an embodiment of a circuit arrangement of the present invention.

FIG. 1 shows the design and the operation of the circuit arrangement of the present invention. An active sensor 1, which can be a wheel speed sensor of an anti-lock system for automotive vehicles, for example, issues a binary current signal $I_S$, i.e., a square-wave signal having two different current levels. The frequency of the square-wave signal is proportional to the sensed speed of the wheel. The active sensor 1 is connected to the supply voltage, that is, the battery of the vehicle having the voltage $U_B$, on the one hand, and is grounded by way of a current mirror circuit 2, on the other hand. The current $I_S$ delivered by the sensor 1 adopts the values 7 ma (L) and 14 ma (H), for example. The voltage drop across the active sensor 1 must not fall short of a minimum value of e.g. 8 volt to maintain the sensor in function. Thus, the input of the current mirror circuit 2, to which sensor 1 is connected, must have a relatively low ohmic value.

The battery voltage $U_B$ or the generator voltage of a buffer battery of an automotive vehicle typically varies between 9 and 18 volt approximately at a nominal value of 12 volt. The two levels of the sensor signal $I_S$ (the nominal value of which levels shall amount to 7 ma (L) and 14 ma (H)) are also shifted to higher or lower values depending on the actual battery voltage, the tolerances of the individual components, the temperature, etc.

The sensor current $I_S$ is transformed to an extremely smaller, proportional signal current $I_1$ by way of the current mirror circuit 2. The current $I_1$ is drawn from a source having the stabilized voltage $U_K$ by way of an ohmic resistance $R_1$. Thus, the equation $$V_1 = U_K - R_1 \cdot I_1$$

applies to the voltage potential $V_1$ at the nodal point N1. The voltage potential $V_1$ corresponds to the current $I_1$ and, thus, to the sensor current $I_S$.

The voltage signal $V_1$ is evaluated by way of a comparator having hysteresis which includes a comparator 4 comparing the voltage signal $I_1$ with a reference value $U_{Bez}$. Finally, a square-wave signal is applied to the output A of the comparator 4. The square-wave signal adopts a high (H) or low (L) value as a function of the sensor current $I_S$. The condition for the change-over of the comparator 4 in each case is that a hysteresis voltage $\pm U_{Hyst}$ has been overcome which is represented as voltage drop across a feedback resistance $R_H$ in FIG. 1. The generation of the reference value $U_{Bez}$, which is composed of a reference voltage $U_{Ref}$ and a component responsive to the hysteresis voltage, will be described below with reference to FIGS. 2 to 4.

A basic feature of the present invention includes varying the change-over threshold of the comparator 4. This way, the change-over thresholds are adapted to the actual sensor current $I_S$ which is responsive to the operating voltage, manufacturing tolerances, etc. Because the change-over thresholds are adapted, the circuit arrangement of the present invention permits distinguishing between a high signal level (H) or sensor current and a low signal level (L) or sensor current even if the average value of the square-wave sensor signal has shifted due to leakage currents or shunts.

Figure 2:
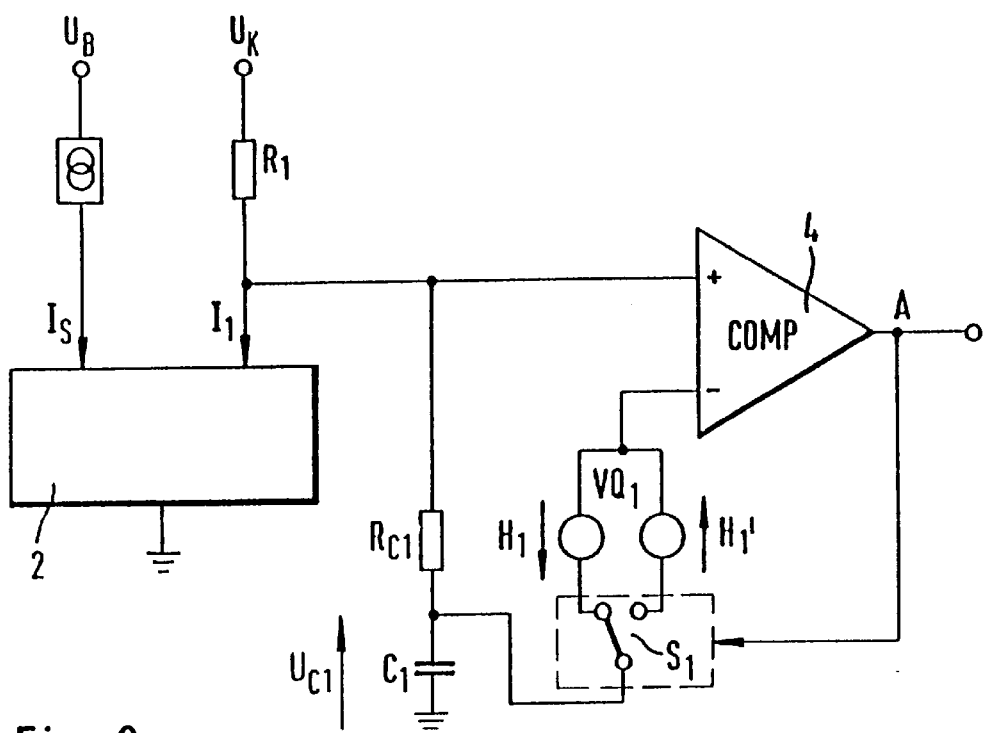
FIGS. 2 to 4 show variants of the circuit arrangement of FIG. 1 in the same type of illustration and with further details.

In FIG. 2, the change-over threshold of the comparator 4 is adapted to the sensor current $I_S$ or the mirrored current $I_1$ by way of a capacitor C1 which is charged to the potential $V_1$, prevailing at the nodal point N1 or the measuring input of the comparator 4, by way of an ohmic resistance $R_{C1}$. C1 and $R_{C1}$ are conformed to each other so that the capacitor voltage $U_{C1}$ will follow the signal change from H to L and vice-versa even if the frequency of the square-wave signal (at high wheel speed) is high. On the other hand, it is desirable that the capacitor voltage varies only slightly during the edge duration, i.e., during the change from H to L or L to H.

The switching hysteresis in the embodiment of FIG. 2 is produced by way of a constant voltage source $VQ_1$ which furnishes the hysteresis voltage $H_1$, $H'_1$. The constant voltage source $VQ_1$ with alternating polarity $H_1$, $H'_1$ is interposed between the reference voltage or capacitor voltage $U_{C1}$ and the comparator input negative input by way of a change-over switch S1. The switch position is responsive to the logic level H or L at the output of the comparator 4. Thus, the reference value at the input negative input of the comparator 4 is the reference voltage $U_{C1}$ plus or minus the constant voltage $H_1$, $H'_1$ which corresponds to the hysteresis voltage. When the comparator with hysteresis of FIG. 2 is realized by way of an integrated circuit, constant voltage sources $VQ_1$ of alternating polarity $H_1$, $H_1$ of this type may be achieved in a different fashion.

Figure 3:
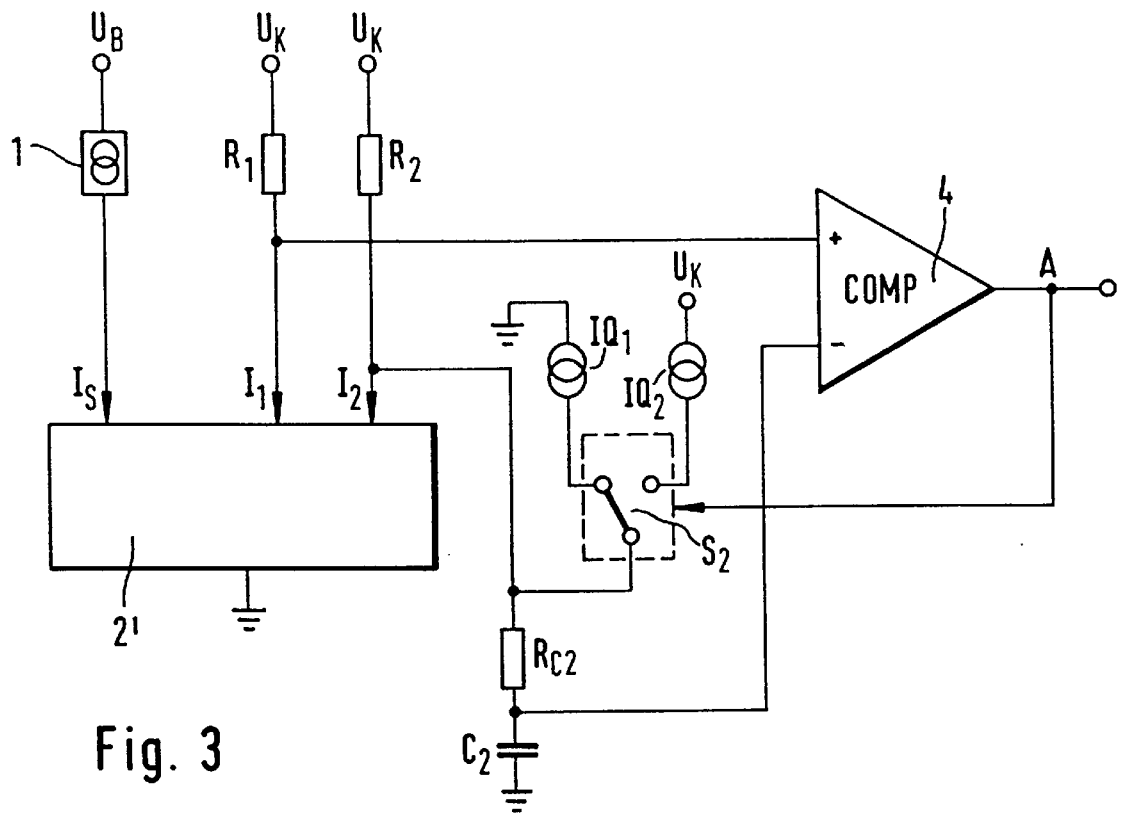

The circuit of FIG. 3 differs from the embodiment of FIG. 2 because the reference voltage $U_{Ref}$ or $U_{C2}$ is generated by means of another circuit branch which also conducts a mirrored current $I_2$ that is proportional to the sensor current $I_3$. Because this circuit branch is also connected to the constant voltage source $U_K$, $I_1$ will equal $I_2$ if the resistances $R_1$, $R_2$ are equal, by way of which the currents $I_1$, $I_2$ are drawn from the constant voltage source $U_K$.

In contrast to FIG. 2, the hysteresis voltage in FIG. 3, the polarity of which must alternate during each change-over of the comparator 4, is produced by way of constant current sources $IQ_1$, $IQ_2$. Constant current sources $IQ_1$, $IQ_2$ furnish an additional charging current for the capacitor $C_2$ by way of a change-over switch $S_2$. The position of switch $S_2$ depends on the level H or L at the output A of the comparator 4. In turn, a reference value prevails at the input negative input of the comparator 4. The reference value includes a component, which is responsive to the sensor current Is or the mirrored current $I_2$, and a component which is representative of the hysteresis voltage and produced by way of the current sources $IQ_1$, $IQ_2$.

Figure 4:
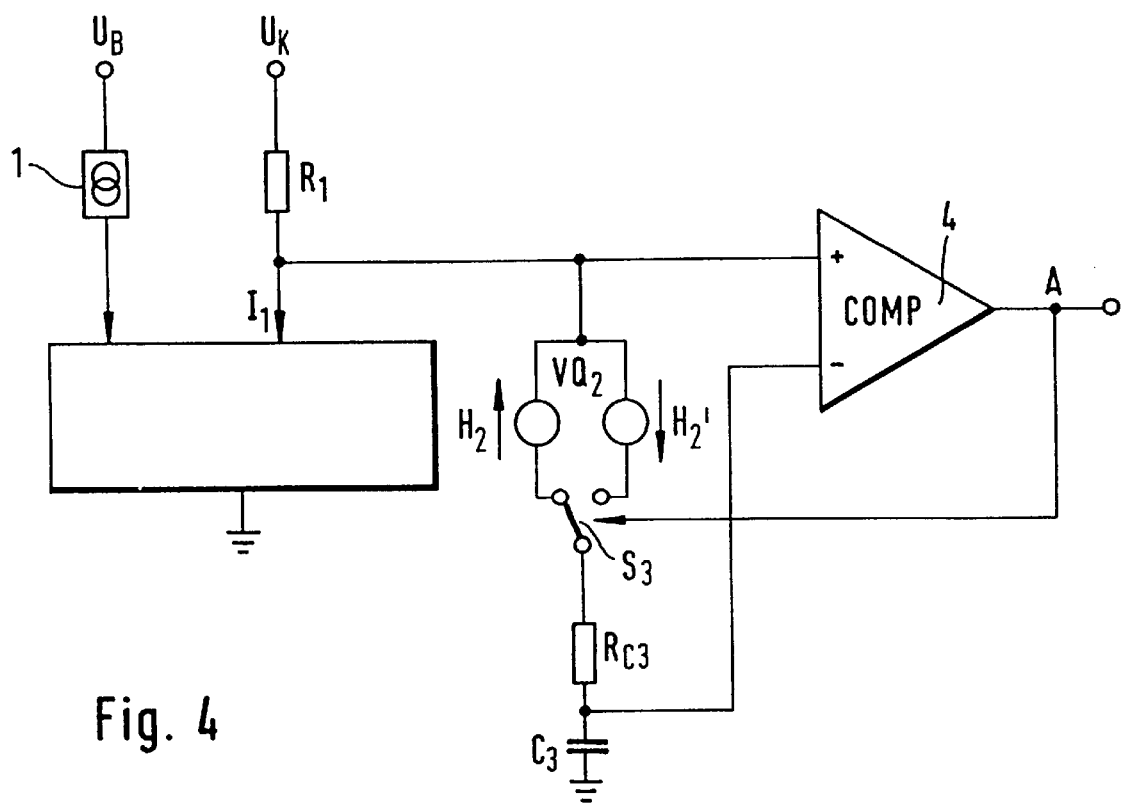

In FIG. 4, a voltage source $VQ_2$ of alternating polarity is inserted by way of a change-over switch $S_3$ into the path which extends from the signal input or positive input of the comparator 4 to a capacitor $C_3$ in order to combine the voltage across the capacitor $C_3$ of a component that is proportional to the mirrored sensor current $I_1$ and a component that takes the necessary hysteresis voltage $H_2$, $H'_2$ into account. In addition to the embodiments disclosed in FIGS. 2 and 4, there are still other, principally equivalent possibilities of generating an adapted reference value which takes into account the respective battery voltage $U_B$ and the tolerances, and also causes a switching hysteresis. The capacitor, and the resistance which is decisive for the charging and discharging periods of the capacitor, in any case must be rated so that the capacitor voltage changes only insignificantly during the signal edges. However, a charge exchange must be permitted during the alternating signal conditions (H/L, L/H).

Figure 5A:
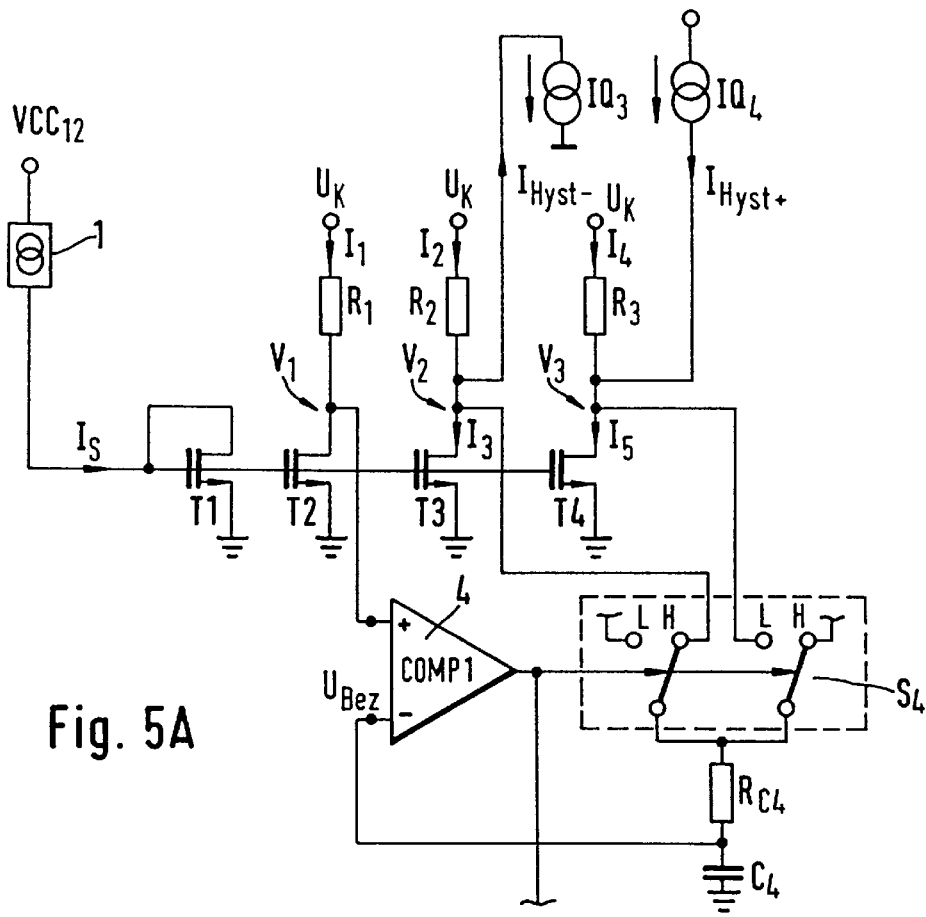
FIGS. 5A, 5B show another variant of the circuit arrangement of the present invention including a window comparator (FIG. 5B).

FIG. 5A shows further details of a circuit arrangement of the type of the present invention. The current mirroring operation is performed by way of transistors T1 to T4 which are comprised in one common integrated circuit. T1 is the input stage of the current mirror circuit which is supplied with the sensor current $I_S$ of the active sensor 1. The sensor current $I_S$ is mirrored in the transistor stages T2, T3, T4. The generation of a voltage signal $V_1$ that corresponds to the sensor current $I_S$ and the evaluation of the voltage signal by way of the comparator 4 is similar to the embodiment of FIG. 3. Therefore, identical parts have been assigned like reference numerals and terms.

The switching hysteresis and reference voltage of FIG. 5A is achieved by way of the transistors T3, T4, which also mirror the sensor current $I_S$, by way of the constant current sources $IQ_3$, $IQ_4$ and a change-over switch $S_4$ which is also realized by switching transistors of the common integrated circuit. The reference value $U_{Bez}$ for the voltage signal at the input N of the comparator 4, in turn, is produced by a capacitor $C_4$ which is charged by way of a resistance $R_{C4}$.

Thus, the sensor current $I_S$ is converted in the current mirror T1, T2 in the fashion described above. When $A_1$, $A_2$ refer to the surfaces of the transistors T1, T2 of the integrated circuit, the relation $$I_1 = A_2/A_1 \times I_S$$

applies to $I_1$. Therefore, a potential $V_1$ is present at the drain port of the transistor T2 and must be calculated as follows:

$$V_2 = U_K - R_1 I_1.$$

Appropriately, T3 and $R_2$ are rated so that the drain voltage at the transistor T3 is identical to the drain voltage at transistor T2 if $I_{Hyst-} = 0$. In consideration of the current $I_{Hyst-}$, the following drain voltage is present at transistor T3:

$$V_2 = U_K - R_2(I_3 + I_{Hyst-})$$

and, hence, $$V_2 = U_K - R_2((A_3/A_1)I_S + I_{Hyst-})$$

The current source $I_{Q3}$ and, thus, $I_{Hyst-}$ are rated so that a voltage $V_2$ is caused which corresponds to the voltage $V_1$ minus a differential voltage $\Delta V_1$. $\Delta V_1$ corresponds to the minimum current difference between the sensor current level H (High) and the sensor current level L (Low). Hence, the relations $$V_2 = V_1 - \Delta V_1 \text{ and}$$

$$\Delta V_1 = R_1(A_2/A_1)\,(I_{Hmin} - I_{Lmax})$$

apply. When a current level L is identified by the comparator 4, the capacitor $C_4$ is charged until the previously discharged voltage $V_2$ is reached. When the sensor current $I_S$ rises, the comparator 4 will switch over as soon as the current has been increased by an amount $I_{Hmin} - I_{Lmax}$ which corresponds to the switching hysteresis. Subsequently, the capacitor $C_4$ is charged to the voltage $V_3$. This voltage is adjusted to the change-over point or the transition from the High(H) to the Low(L) current edge. At $R_2 = R_3$ and $A_3 = A_4$, the relation $$V_3 = V_1 + \Delta V_1$$

applies. The comparator 4 is switched back when the sensor current, starting from the current level H, drops by the amount $I_{Hmin} - I_{Lmax}$ which corresponds to the switching hysteresis.

As mentioned before, it applies to the rating of the capacitor $C_4$ and the resistance $R_{C4}$ that the capacitor voltage should hardly vary during the switching edges, and that the shortest period of change-over from H to L or L to H must be sufficient to change the capacitor voltage corresponding to the signal variation $V_2$ or $V_3$.

Principally, the current sources $I_{Q3}$ and $I_{Q4}$ may be derived from a common current source by a current mirroring operation. Two independent current sources are shown in FIG. 5A for the sake of simplicity.

Because the change-over threshold of the flipflop 3 or the comparator 4 is adapted as described by way of FIGS. 1 to 5, an identification and evaluation of the sensor signal $I_S$ is possible even if the current level L of the sensor current $I_S$ becomes higher than $I_{Lmax}$ or the current level H becomes lower than $I_{Hmin}$ due to leakage currents, shunts, etc. A sensor signal is identified even if L and H levels range between $I_{Hmin}$ and $I_{Hmax}$ or between $I_{Lmin}$ and $I_{Lmax}$. The switching hysteresis of $I_{Hmin} - I_{Lmax}$ is maintained even under these extreme conditions.

Figure 5B:
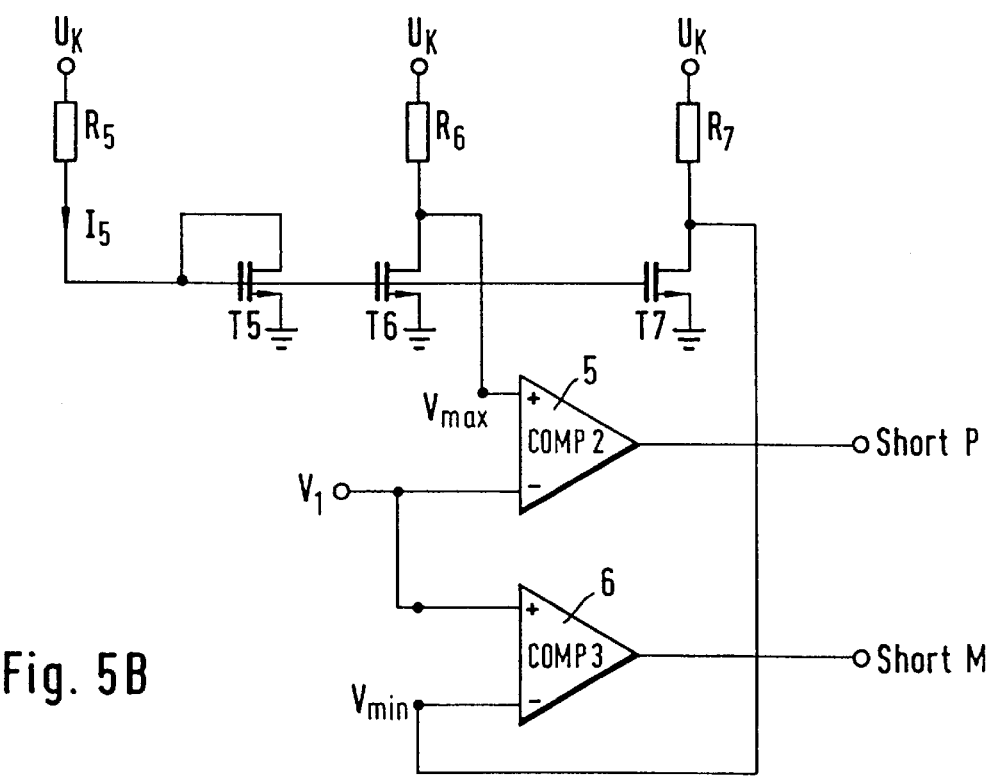

If the leakage currents or shunts exceed a defined rate, or if there is a sensor error, a line interruption, or the like, the defective condition is signalled by way of a window comparator, as shown in FIG. 5B, which is mounted on the same IC as the circuit of FIG. 5A.

The allowable limits of the voltage signal $V_1$ are defined by way of a current mirror circuit T5, T6, T7. The top limit is determined by the current $I_5$ which is drawn from the stabilized voltage source $U_K$ by way of an ohmic resistance $R_5$. A current is mirrored from T5 to T6 which corresponds to the maximum allowable current. If $R_6$ equals $R_1$, a voltage value indicative of the top limit $V_{max}$ is present at the drain port of the transistor T6. If $V_1$ exceeds the voltage value $V_{max}$, this is assessed as a sensor error. A comparator 5 compares $V_1$ with the voltage potential at the drain of transistor T6. 'H' at the output "Short P" of the comparator 5 signals a short-circuit or an inadmissibly high shunt between the sensor 1 or the sensor line and the supply voltage $U_B$.

The sensor current $I_S$ drops below its minimum value when any one of the sensor connections is short-circuited to ground, when current discharges to ground through a leakage resistance, or when sensor lines are interrupted. This condition is identified by way of the circuit of FIG. 5B as follows: a current is mirrored from the transistor T5 across T7 which corresponds to the minimum sensor current. If $R_7$ equals $R_1$, a voltage value $V_{min}$ results at the drain port of the transistor T7 indicating that there must be a sensor error when the voltage value falls short of. A comparator 6 compares $V_1$ with the potential $V_{min}$ at the drain of the transistor T7. 'H' at the output "Short M" of the comparator 6 indicates that the predetermined minimum sensor current falls short of.

The output signal of the comparator 5 (Short P) is appropriately evaluated (which is not shown, however) to interrupt the sensor current $I_S$ and to thereby protect the input transistor T1 against overcharging.

We claim:

1. A circuit for evaluating an output signal of an active sensor which is configured as a binary current signal having a square-wave output signal with two different current levels, comprising:

means for producing a signal current proportional to the sensor output signal by way of a current mirror circuit, the signal current induced by a first circuit branch of said current mirror circuit is drawn from a voltage source by way of an ohmic resistance, whereby a binary voltage signal corresponding to the sensor output signal is generated, comparator means having a first input coupled to said binary voltage signal, wherein said comparator means includes hysteresis characteristics which are implemented by comparing the binary voltage signal with a reference signal, wherein said reference signal is composed of a serial connection of a reference voltage and a hysteresis voltage, wherein the change-over threshold of the comparator means is responsive to the reference value signal, wherein the reference voltage is varied as a function of the sensor output signal, and wherein the reference voltage is produced by way of a capacitor which is connected to a second input of said comparator means.

2. Circuit arrangement as claimed in claim 1, wherein the hysteresis voltage includes a constant voltage source whose output polarity alternates with each change-over of the comparator mean.

3. Circuit arrangement as claimed in claim 1, wherein the hysteresis voltage is produced by two constant current sources which increase or decrease the capacitor voltage responsive to the switch condition of the comparator means.

4. Circuit arrangement as claimed in claim 1, wherein the voltage source, from which the mirrored currents are drawn, is stabilized.

5. A circuit for evaluating an output signal of an active sensor which is configured as a binary current signal having a square-wave output signal with two different current levels, comprising:

means for producing a signal current proportional to the sensor output signal by way of a current mirror circuit, the signal current induced by a first circuit branch of said current mirror circuit is drawn from a voltage source by way of an ohmic resistance, whereby a binary voltage signal corresponding to the sensor output signal is generated, comparator means having a first input coupled to said binary voltage signal, wherein said comparator means includes hysteresis characteristics which are implemented by comparing the binary voltage signal with a reference signal coupled to a second input of said comparator mean, wherein said reference signal is composed of a serial connection of a reference voltage and a hysteresis voltage, wherein the change-over threshold of the comparator means is responsive to the reference signal, wherein the reference voltage is varied as a function of the sensor output signal wherein the reference voltage is produced by way of a capacitor which is connected to a second circuit branch of the current mirror circuit by way of an ohmic resistance.

6. Circuit arrangement as claimed in claim 5, wherein the reference signal is provided by series connection of the reference voltage and a constant voltage source which furnishes the hysteresis voltage and has a polarity alternating with each change-over of the comparator means.

7. Circuit arrangement as claimed in claim 5, wherein the hysteresis voltage is produced by constant current sources which increase or decrease the capacitor voltage responsive to the switch condition of the comparator means.

\* \* \* \* \*

UNITED STATES PATENT AND TRADEMARK OFFICE
CERTIFICATE OF CORRECTION

PATENT NO. : 5,880,614
DATED : March 9, 1999
INVENTOR(S) : Olaf Zinke, et. al.

It is certified that error appears in the above-identified patent and that said Letters Patent is hereby corrected as shown below:

Column 6, line 37, claim 1, line 20, delete "value"

line 46, claim 2, line 4, replace "mean" with --means--

Column 7, line 4, claim 5, line 16, replace "mean" with --means--

Signed and Sealed this

Eighth Day of February, 2000

Attest:

Q. TODD DICKINSON

Attesting Officer

Commissioner of Patents and Trademarks